United States Patent
Liu et al.

(10) Patent No.: US 6,300,227 B1
(45) Date of Patent: *Oct. 9, 2001

(54) ENHANCED PLASMA MODE AND SYSTEM FOR PLASMA IMMERSION ION IMPLANTATION

(75) Inventors: Wei Liu, San Jose; Michael A. Bryan, Los Gatos; Ian S. Roth, Palo Alto, all of CA (US)

(73) Assignee: Silicon Genesis Corporation, Campbell, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,025

(22) Filed: Dec. 1, 1998

(51) Int. Cl.$^7$ ............................... H01L 21/00; H05H 1/00
(52) U.S. Cl. ..................... 438/513; 438/515; 118/723 IR
(58) Field of Search ......................... 156/345; 118/723 I, 118/723 IR; 204/298.37; 216/68; 438/732, 798, 514, 515, 513

(56) References Cited

U.S. PATENT DOCUMENTS

| | | |
|---|---|---|
| 4,745,337 | 5/1988 | Pichot et al. . |
| 5,032,205 | 7/1991 | Hershkowitz et al. . |
| 5,178,739 | 1/1993 | Barnes et al. . |
| 5,304,279 * | 4/1994 | Coultas et al. ............ 156/345 |
| 5,421,891 * | 6/1995 | Campbell et al. ......... 118/723 R |
| 5,593,741 | 1/1997 | Ikeda . |
| 5,653,811 | 8/1997 | Chan . |
| 5,674,321 | 10/1997 | Pu et al. ................... 118/723 |

OTHER PUBLICATIONS

Berry, Lee A. et al., "Permanent magnet electron cyclotron resonance plasma source with remote window," *J. Vac. Sci. Technol.* A 13(2), pp. 343–348 (1995).
Hwang, S.W. et al., "Effects of variously configured magnets on the characteristics of inductively coupled plasmas," *J. Vac. Sci. Technol.* A 17(4), pp. 1211–1216 (1999).
Kadlec, S. et al., "Optimized magnetic field shape for low pressure magnetron sputtering," *J. Vac. Sci. Technol.* A 13(2), pp. 389–393 (1995).
Lai C. et al., "Magnetically confined inductively coupled plasma etching reactor," *J. Vac. Sci. Technol.* A 13(4), pp. 2086–2092 (1995).
Samukawa, Seiji, "Effect of a multiple–cusp magnetic field on electron confinement in a pulse–time–modulated plasma," *Appl. Phys. Lett.* 69(22), pp. 3330–3332 (1996).
Feurprier, Y. et al., "Influence of the gas mixture on the reactive ion etching of InP in $CH_4$–$H_2$ plasmas," J. Vac. Sci. Technol. B 15(5), pp. 1733–1740 (1997).

* cited by examiner

Primary Examiner—Thi Dang
(74) Attorney, Agent, or Firm—Townsend and Townsend and Crew LLP

(57) ABSTRACT

A novel plasma treatment method (800, 814). The method includes forming an rf plasma discharge in a vacuum chamber. The plasma discharge includes an inductive coupling structure, which has a first cusp region at a first end of the structure and a second cusp region at a second end of the structure. In some embodiments, a third cusp region, which is between the first and second cusp regions, can also be included. The first cusp region is provided by a first electromagnetic source and the second cusp region is provided by a second-electro magnetic source. The first electro-magnetic source and the second electro-magnetic source confines a substantial portion of the rf plasma discharge to a region away from a wall of the vacuum chamber. Accordingly, a plasma discharge is substantially a single ionic species (e.g., $H_1$+) can be formed.

16 Claims, 11 Drawing Sheets

ENHANCED PLASMA MODE AND SYSTEM FOR PLASMA IMMERSION ION IMPLANTATION

CROSS-REFERENCE TO RELATED PATENT APPLICATIONS

The following five commonly-owned co-pending applications, including this one, are being filed concurrently and the other four are hereby incorporated by reference in their entirety for all purposes:

1. U.S. patent application Ser. No. 09/201,946 Wei Liu, et al., entitled, "Enhanced Plasma Mode and System For Plasma Immersion Ion Implantation,";

2. U.S. patent application Ser. No. 09/203,025 Wei Liu, et al., entitled, "Enhanced Plasma Mode and Method For Plasma Immersion Ion Implantation,";

3. U.S. patent application Ser. No. 09/201,933 Wei Liu, et al., entitled, "Enhanced Plasma Mode and Computer System For Layer Transfer Processes,";

4. U.S. Provisional Patent Application Ser. No. 60/110,378 Wei Liu, et al., entitled, "Enhanced Plasma Mode, Method, and System For Domed Chamber Designs,"; and 5. U.S. Provisional Patent Application Ser. No. 60/110,528 Wei Liu, et al., entitled, "Enhanced Plasma Mode, Method, and System For Chamber Designs,".

BACKGROUND OF THE INVENTION

The present invention relates to the manufacture of objects. More particularly, the present invention provides a technique for providing a combination of a plasma discharge and an applied magnetic field for creating a high density plasma source. The present invention can be applied to implanting particles for the manufacture of integrated circuits, for example. But it will be recognized that the invention has a wider range of applicability; it can also be applied to implanting particles for other substrates such as multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), doping semiconductor devices, biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are made by processing techniques such as ion implantation or the like to introduce impurities or ions into the substrate. These impurities or ions are introduced into the substrate to selectively change the electrical characteristics of the substrate, and therefore devices being formed on the substrate. Ion implantation provides accurate placement of impurities or ions into the substrate. Ion implantation, however, is expensive and generally cannot be used effectively for introducing impurities into a larger substrate such as glass or a semiconductor substrate, which is used for the manufacture of flat panel displays or the like.

Accordingly, plasma treatment of large area substrates such as glass or semiconductor substrates has been proposed or used in the fabrication of flat panel displays or 300 millimeter silicon wafers. Plasma treatment is commonly called plasma immersion ion implantation ("PIII") or plasma source ion implantation ("PSI"). Plasma treatment generally uses a chamber, which has an inductively coupled plasma source, for generating and maintaining a plasma therein. A large voltage differential between the plasma and the substrate to be implanted accelerates impurities or ions from the plasma into the surface or depth of the substrate. A variety of limitations exist with the convention plasma processing techniques.

A major limitation with conventional plasma processing techniques is the maintenance of the uniformity of the plasma density and chemistry over such a large area is often difficult. As merely an example, inductively or transformer coupled plasma sources ("ICP" and "TCP," respectively) are affected both by difficulties of maintaining plasma uniformity using inductive coil antenna designs. Additionally, these sources are often costly and generally difficult to maintain, in part, because such sources which require large and thick quartz windows for coupling the antenna radiation into the processing chamber. The thick quartz windows often cause an increase in radio frequency ("rf") power (or reduction in efficiency) due to heat dissipation within the window.

Other techniques such as Electron Cyclotron Resonance ("ECR") and Helicon type sources are limited by the difficulty in scaling the resonant magnetic field to large areas when a single antenna or wave guide is used. Furthermore, most ECR sources utilize microwave power. Microwave power is often more expensive and difficult to tune electrically. Hot cathode plasma sources have been used or proposed. The hot cathode plasma sources often produce contamination of the plasma environment due to the evaporation of cathode material. Alternatively, cold cathode sources have also be used or proposed. These cold cathode sources often produce contamination due to exposure of the cold cathode to the plasma generated.

A pioneering technique has been developed to improve or, perhaps, even replace these conventional sources for implantation of impurities. This technique has been developed by Dr. Chung Chan of Waban Technology in Massachusetts, now Silicon Genesis Corporation, and has been described in U.S. Pat. No. 5,653,811 ("Chan"), which is hereby incorporated by reference herein for all purposes. Chan generally describes techniques for treating a substrate with a plasma with an improved plasma processing system. The improved plasma processing system, includes, among other elements, at least two rf sources, which are operative to generate a plasma in a vacuum chamber. By way of the multiple sources, the improved plasma system provides a more uniform plasma distribution during implantation, for example. It is still desirable, however, to provide even a more uniform plasma for the manufacture of substrates.

From the above, it is seen that an improved technique for introducing impurities into a substrate is highly desired.

SUMMARY OF THE INVENTION

According to the present invention, a technique including a method for providing a high density plasma source is provided. In an exemplary embodiment, the present invention provides a method that uses a combination of a high frequency source and a magnetic source to form a high density plasma. The high density plasma source can provide a plasma that is substantially a single isotope of hydrogen, for example.

In a specific embodiment, the present invention provides a novel method for forming a plasma. The method includes forming an rf plasma discharge in a vacuum chamber. The plasma discharge includes an inductive coupling structure, which has a first cusp region at a first end of the structure and a second cusp region at a second end of the structure. In some embodiments, a third cusp region, which is between the first and second cusp regions, can also be included. The first cusp region is provided by a first electro-magnetic source and the second cusp region is provided by a second-electro magnetic source. The first electro-magnetic source and the second electro-magnetic source confines a substantial portion of the rf plasma discharge to a region away from a wall of the vacuum chamber. Accordingly, a plasma discharge is substantially a single ionic species can be formed.

In an alternative embodiment, the present invention includes a novel method for implanting particles using a plasma source. The method includes forming an rf plasma discharge in a vacuum chamber. The plasma discharge includes an inductive coupling structure, which has a first cusp region at a first end of the structure and a second cusp region at a second end of the structure. In some embodiments, a third cusp region, which is between the first and second cusp regions, can also be included. The first cusp region is provided by a first electro-magnetic source and the second cusp region is provided by a second-electro magnetic source. The first electro-magnetic source and the second electro-magnetic source confine a substantial portion of the rf plasma discharge to a region away from a wall of the vacuum chamber. The method also includes biasing a substrate relative to the plasma discharge to introduced particles from the plasma into the substrate. By way of the plasma discharge, which can be substantially a single ionic species (e.g., $H_1+$), a uniform distribution of implanted particles at a selected depth in the substrate is achieved.

Numerous benefits are achieved by way of the present invention. In one aspect, the present invention provides a high density plasma source that is rich with hydrogen bearing particles in the $H_1+$ state. This high density source is an active which allows the hydrogen bearing particles to be implanted in a uniform manner through a surface of a substrate such as a silicon wafer. In another aspect, the present invention achieves a high density plasma source in a simple and elegant source design, which uses a lower amount of rf power than conventional multi-coil sources. The present invention also provides a method for igniting the plasma source in a "proton" state, which is highly efficient. Depending upon the embodiment, one or more of these benefits is present. These and other advantages or benefits are described throughout the present specification and are described more particularly below.

These and other embodiments of the present invention, as well as its advantages and features are described in more detail in conjunction with the text below and attached FIGS.

DESCRIPTION OF THE SPECIFIC EMBODIMENTS

Figure 1A:
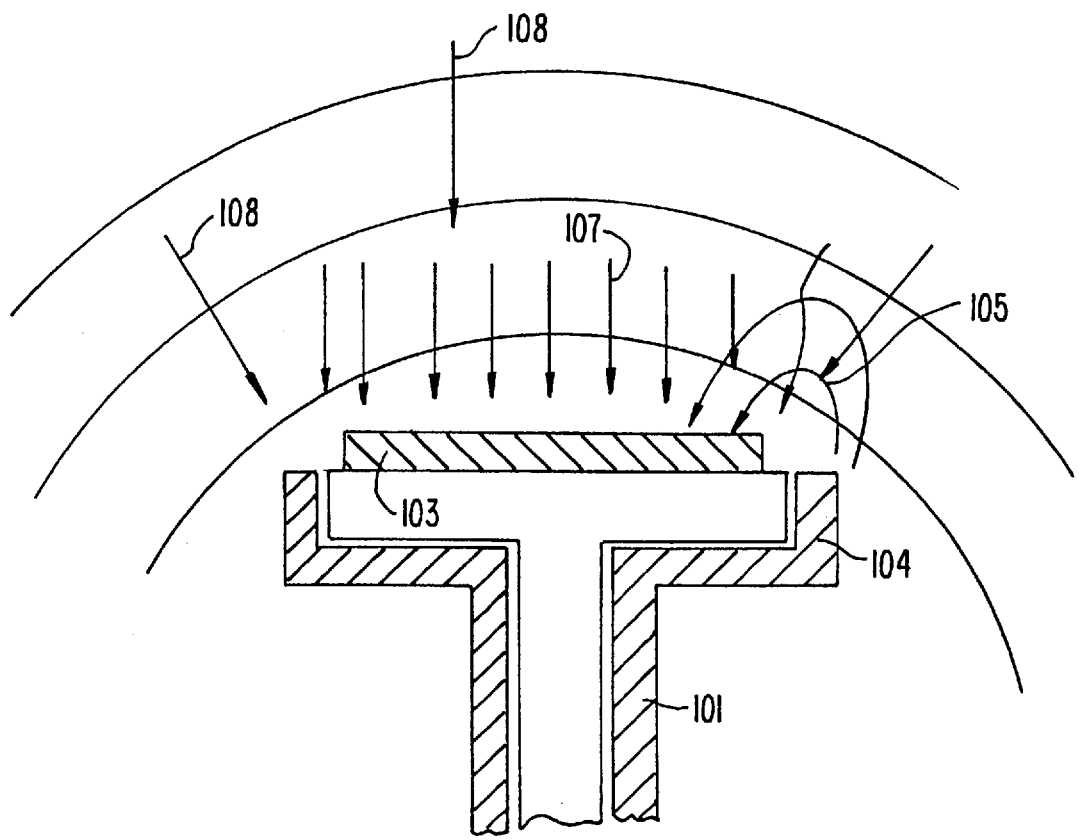
FIG. 1 is a simplified block diagram of a conventional plasma treatment system.

According to the present invention, a technique including a method and system for providing a high density plasma source is provided. In an exemplary embodiment, the present invention provides an apparatus that uses a combination of a high frequency source and a magnetic source to form a high density plasma. The high density plasma can provide a plasma that is substantially a single isotope of hydrogen, for example.

1. Conventional Plasma Processing System

In brief overview and referring to FIG. 1, conventional plasma processing system 10 includes a vacuum chamber 14 having a vacuum port 18 connected to a vacuum pump (not shown). The system 10 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in a system having a helical or pancake antennae 46 located within an outer shield/ground 44. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 10 being removed. Although glass windows are used, other dielectric material such as quartz or polyethylene may be used for the window material.

Each antenna 46 is connected to an rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 62. By individually adjusting the tuning capacitors 85, the output power from each rf antenna 46 can be adjusted to maintain the uniformity of the plasma generated. Other tuning means such as zero reflective power tuning may also be used to adjust the power to the antennae. The rf generator 66 is controlled by a signal E from the controller 62. The controller 62 controls the power to the antennae 46 by a signal F to the matching network 50.

The controller 62 adjusts the tuning capacitors 58 and the rf generator 66 in response to signals A, B, and C. Here, signal A is from a sensor 70 monitoring the power delivered to the antennae 46. Signal B is from a fast scanning Langmuir probe 74 directly measuring the plasma density. Signal C is from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 10 to plasma treat a substrate. Once the settings are determined, the probes are removed and the wafer to be treated is introduced. The probes are left in place during processing to permit real time control of the system. Care must be taken to not contaminate the plasma with particles evaporating from the probe and to not shadow the substrate being processed.

Figure 1B:
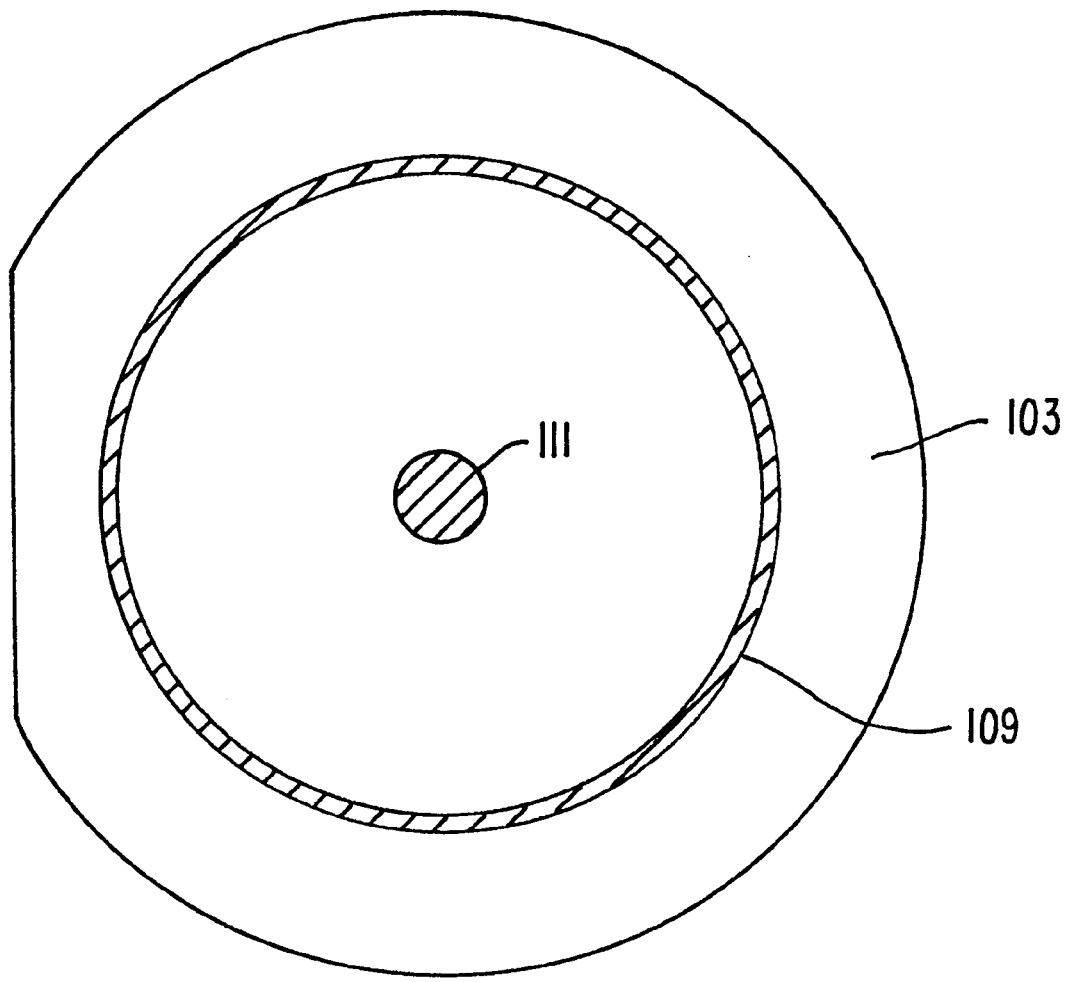

This conventional system has numerous limitations. For example, the conventional system 10 includes wafer holder 82 that is surrounded by a quartz liner 101. The quartz liner is intended to reduce unintentional contaminants sputtered from the sample stage to impinge or come in contact with the substrate 103, which should be kept substantially free from contaminates. Additionally, the quartz liner is intended to reduce current load on the high voltage modulator and power supply. The quartz liner, however, often attracts impurities or ions 104 that attach themselves to the quartz liner by way of charging, as shown by FIG. 1A. By way of this attachment, the quartz liner becomes charged, which changes the path of ions 105 from a normal trajectory 107. The change in path can cause non-uniformities during a plasma immersion implantation process. FIG. 1B shows a simplified top-view diagram of substrate 103 that has high concentration regions 111 and 109, which indicate non-uniformity. In some conventional systems, the liner can also be made of a material such as aluminum. Aluminum is problematic in conventional processing since aluminum particles can sputter off of the liner and attach themselves to the substrate. Aluminum particles on the substrate can cause a variety of functional and reliability problems in devices that are manufactured on the substrate. A wafer stage made of stainless steel can introduce particulate contamination such as iron, chromium, nickel, and others to the substrate. A paper authored by Zhineng Fan, Paul K. Chu, Chung Chan, and Nathan W. Cheung, entitled "Dose and Energy Non-Uniformity Caused By Focusing Effects During Plasma Immersion Ion Implantation," published in "Applied Physics Letters" describes some of the limitations mentioned herein.

Additionally, the conventional system introduces ions 108 toward the substrate surface in a non-uniform manner. As shown, ions accelerate toward the substrate surface at varying angles and fluxes. These varying angles and fluxes tend to create a non-uniform ion distribution in the substrate material. The non-uniform distribution of ions in the substrate can create numerous problems. For example, a non-uniform distribution of ions in a substrate used for a film transfer process such as Smart Cut™ or a controlled cleaving process can ultimately create a non-uniform detached film, which is highly undesirable in the manufacture of integrated circuits. Accordingly, it is generally desirable to form a uniform distribution of ions at a selected depth in the substrate material for film transfer processes.

2. Present Plasma Immersion Systems

Figure 2:
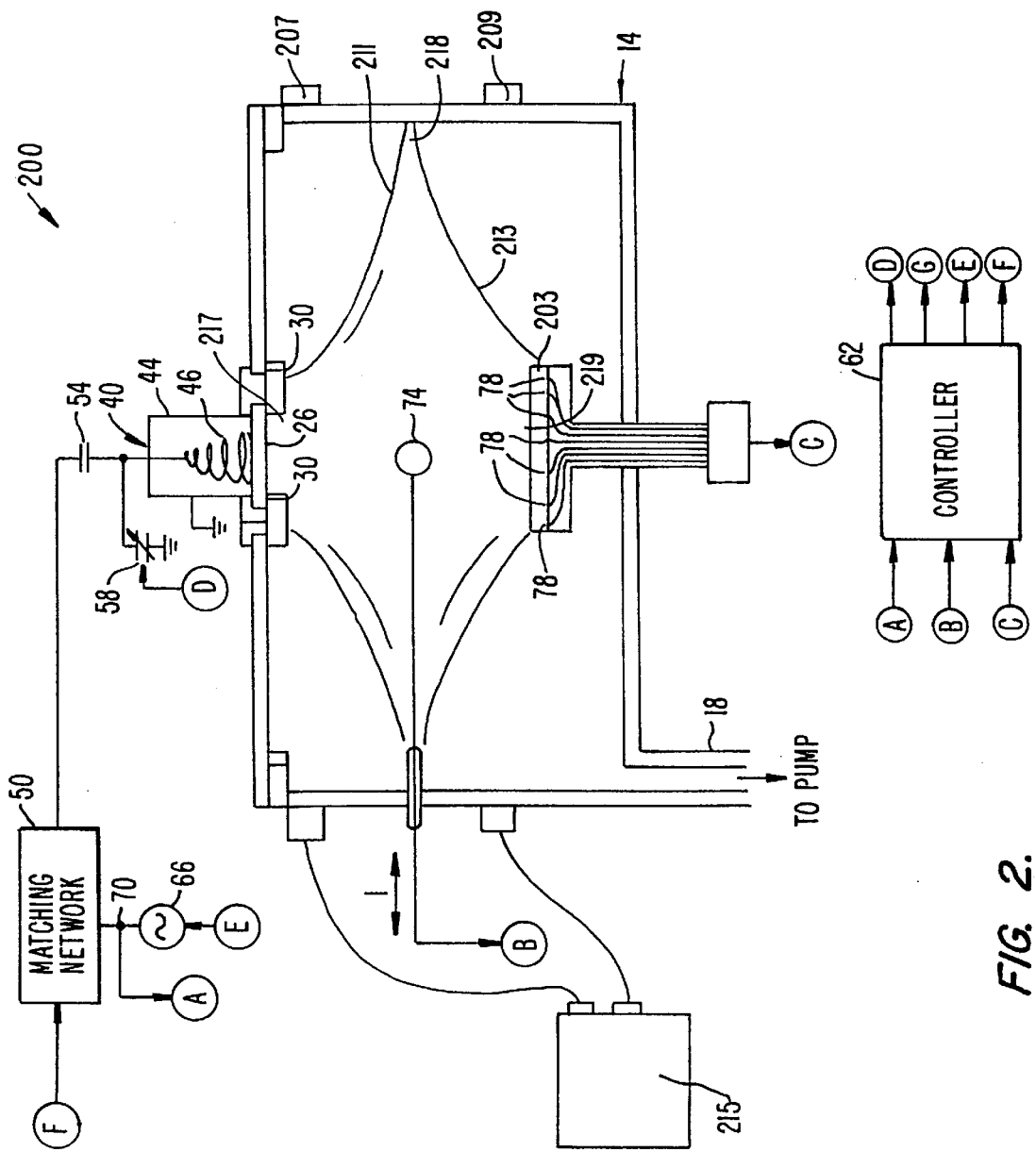
FIGS. 2–7 are simplified diagrams of plasma treatment systems according to embodiments of the present invention.

FIG. 2 is a simplified overview of a plasma treatment system 200 for implanting particles according to an embodiment of the present invention. This diagram is merely an illustration and should not limit the scope of the claims herein. One of ordinary skill in the art would recognize other variations, modifications, and alternatives. For easy reading, some of the reference numerals used in FIG. 1 are used in FIG. 2 and others. In a specific embodiment, system 200 includes a vacuum chamber 14 having a vacuum port 18 connected to a vacuum pump (not shown). The system 200 includes a dielectric window 26 vacuum sealed by o-rings 30 and attached by removable clamps 34 to the upper surface 22 of the vacuum chamber 14. Removably attached to the dielectric window 26 is an rf plasma source 40, in one embodiment having a helical or pancake antennae 46 located within an outer shield/ground 44. Other embodiments of the antennae using capacitive or inductive coupling may be used. The rf plasma source can be operated at 13.56 MHz, and other frequencies. Cooling of each antenna is accomplished by passing a cooling fluid through the antenna. Cooling is typically required only at higher power. The window 26 without attached rf plasma sources 40 is usable as a viewing port into the chamber 14. The removability of each plasma source 40 permits the associated dielectric window 26 to be cleaned or the plasma source 40 replaced without the vacuum within the system 10 being removed.

Although a glass window is used in this embodiment, other dielectric materials such as quartz or polyethylene may be used for the window material. Antenna 46 is connected to an rf generator 66 through a matching network 50, through a coupling capacitor 54. Antenna 46 also includes a tuning capacitor 58 connected in parallel with its respective antenna 46. The tuning capacitor 58 is controlled by a signal D from a controller 62. By adjusting the tuning capacitor 85, the output power from the rf antenna 46 can be adjusted to maintain the uniformity of the plasma generated. Other tuning means such as zero reflective power tuning may also be used to adjust the power to the antennae. In one embodiment, the rf generator 66 is controlled by a signal E from the controller 62. In one embodiment, the controller 62 controls the power to the antennae 46 by a signal F to the matching network 50.

The controller 62 adjusts the tuning capacitor 58 and the rf generator 66 in response to signals A, B, and C. Signal A is from a sensor 70 (such as a Real Power Monitor by Comdel, Inc., Beverly, Mass.) monitoring the power delivered to the antennae 46. Signal B is from a fast scanning Langmuir probe 74 directly measuring the plasma density. Signal C is from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 200 to plasma treat a substrate. Once the settings are determined, the probes are removed and the wafer to be treated is introduced. In another embodiment of the system, the probes are left in place during processing to permit real time control of the system. In such an embodiment using a Langmuir probe, care must be taken to not contaminate the plasma with particles evaporating from the probe and to not shadow the substrate being processed. In yet another embodiment of the system, the characteristics of the system are determined at manufacture and the system does not include a plasma probe.

In a preferred embodiment, a magnetic field is applied to the plasma in the vacuum chamber 14. In a specific embodiment, an electro-magnetic source 207 is applied to an upper vessel portion and an electro-magnetic source 209 is applied to a lower vessel portion. These sources and others shape the plasma to form magnetic field lines 211 and 213, which push or shape the plasma away from walls of the vessel. In a specific embodiment, the electro-magnetic source can be a conductor such as a plurality of wires or cables, which conduct current. Alternatively, the magnetic source can be a single conductive member that carries electric current, which forms a magnetic field. In a specific embodiment, the conductor is a plurality of wires, which are wrapped around the periphery of the vessel. The wires are suitably constructed such that they carry enough electric current to influence the plasma in the vessel. In one embodiment, the wires are a plurality of insulated wires that are wrapped around a periphery of the vessel. The insulated wires each include a conductive core.

A power source(s) supplies direct current to the magnetic sources. Magnetic source 207 couples to a power source 215, which supplies direct current in one direction to the wires. Magnetic source 209 couples to power source 215, which supplies direct current in another direction (which is opposite of magnetic source 207). The power source can be any suitable power source such as a DC power supply product (max 50 V or max 50 delta made by a company called Hewlett Packard, but is not limited. The power source is capable of supplying direct current to about 50 amps up to about 50 volts. A power rating of about 2,500 watts or greater is also desirable, but is not limiting.

In a specific embodiment, a combination of the rf plasma source 40 and electro-magnetic sources 207, 109 create "cusp" regions 217, 218, and 219. Here, the combination of the sources are operated in a manner which maintains a substantial portion of the plasma to be confined within a spatial area away from the walls. By way of this confinement, recombination of the plasma species near the walls is reduced. The combination of the sources also provide for a higher plasma density. The high density plasma uses inductive coupling from the rf plasma source and uses the magnetic sources 207 and 209 to shape the plasma. The shaped plasma also has a much higher energy and density than the plasma created by only the rf plasma source. The high density plasma can be used for a number of applications including, plasma immersion ion implantation and others. In some embodiments, a cooling source (not shown) can be applied near an outer wall of the chamber near cusp region 218, which is often concentrated with electrons. The electrons create additional heat near the chamber wall that should be removed by way of the cooling source.

Controller 62 is used to control power to the magnetic sources 207 and 209. Controller 62 includes output G, which selectively adjusts the amount of direct current provided to magnetic source 207. Output G can also selectively adjusts the amount of direct current provided to magnetic source 209. The output can be determined by way of signal B from a fast scanning Langmuir probe 74 directly measuring the plasma density. Alternatively, the output can be determined by signal C, which is from a plurality of Faraday cups 78 attached to a substrate wafer holder 82. The Langmuir probe 74 is scanned by moving the probe (double arrow I) into and out of the plasma. With these sensors, the settings for power supply 215 and for the rf generator 66 and the tuning capacitors 58 may be determined by the controller prior to the actual use of the system 200 to plasma treat a substrate. Once the settings are determined, the probes are removed and the wafer to be treated is introduced. In another embodiment of the system, the probes are left in place during processing to permit real time control of the system. In such an embodiment using a Langmuir probe, care must be taken to not contaminate the plasma with particles evaporating from the probe and to not shadow the substrate being processed. In yet another embodiment of the system, the characteristics of the system are determined at manufacture and the system does not include a plasma probe.

Figure 3:
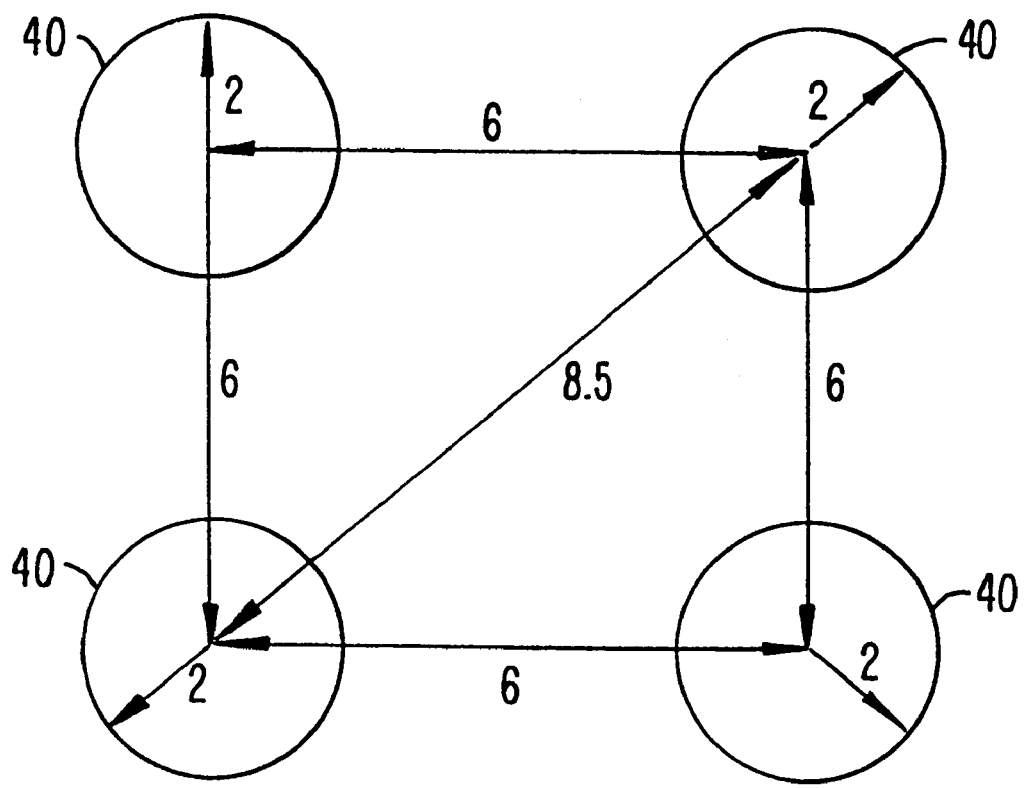

Referring to FIG. 3, the configuration of plasma sources 40 may be such that a plurality of physically smaller plasma sources 40 produce a uniform plasma over an area greater than that of sum of the areas of the individual sources. In the embodiment of the configuration shown, four-inch diameter plasma sources 40 spaced at the corners of a square at six-inch centers produce a plasma substantially equivalent to that generated by a single twelve inch diameter source. Therefore, by providing a vacuum chamber 14 with a plurality of windows 26, the various configurations of plasma sources 40 may be formed to produce a uniform plasma of the shape and uniformity desired. Antennae such as those depicted do not result in rf interference between sources when properly shielded as shown.

Figure 4:
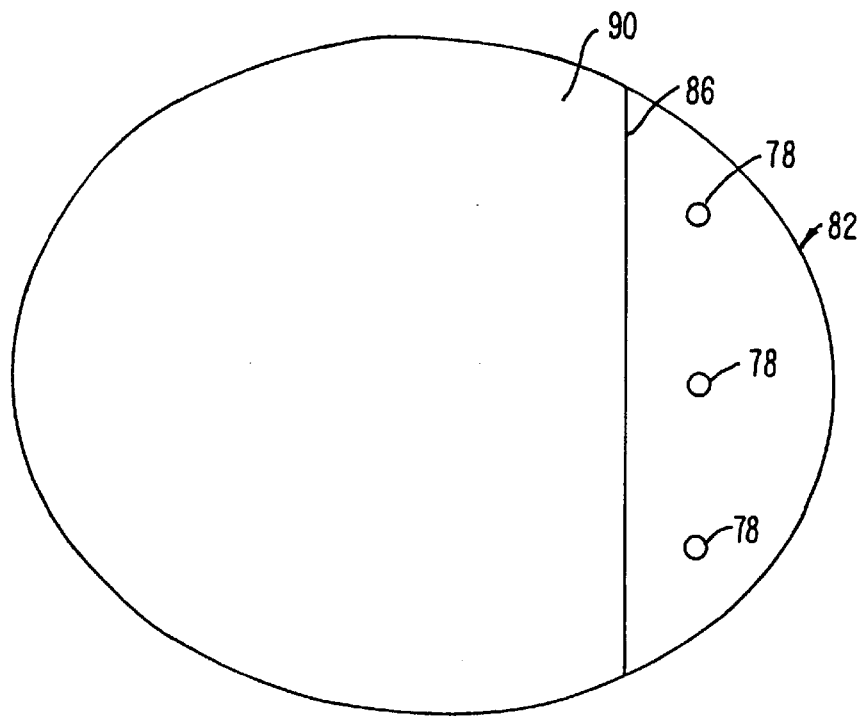
Figure 4A:
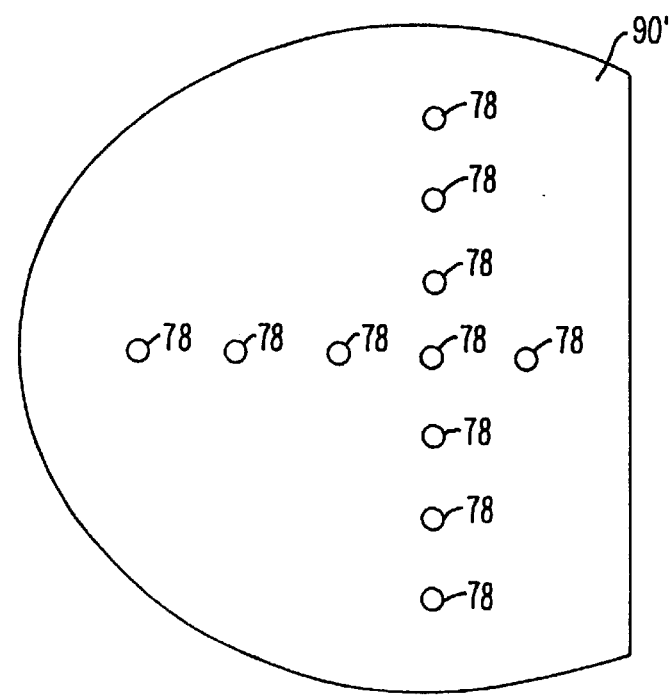

The Faraday cups 78 used to measure the uniformity of the field and the plasma dose, in one embodiment, are positioned near one edge in the surface of the wafer holder 82, which is shown in FIG. 4. The flat edge 86 of wafer 90 is positioned on the wafer holder 82 such that Faraday cups 78 of the wafer holder 82 are exposed to the plasma. In this way the plasma dose experienced by the wafer 90 can be directly measured. Alternatively, a special wafer 90', as shown in FIG. 4A, is fabricated with a plurality of Faraday cups 78 embedded in the wafer 90'. This special wafer 90' is used to set the rf generator 66 and the tuning capacitors 58 to achieve the desired plasma density and uniformity. Once the operating parameters have been determined, the special wafer 90' is removed and the wafers 90 to be processed are placed on the wafer holder 82.

Figure 5:
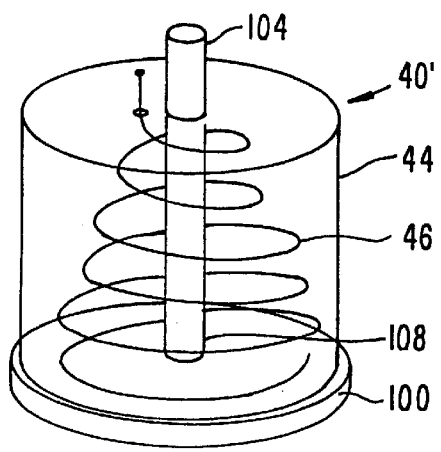

Referring to FIG. 5, in another embodiment, a quartz window 100 is not directly attached to the vacuum chamber 14, but instead encloses one end of the shield 44 of the plasma source 40'. In this embodiment, a tube 104 attached to an opening 108 in the quartz window 100 provides a gas feed to form a plasma of a specific gas. In this case, the plasma source 40' is not attached to a window 26 in the wall of the vacuum chamber 14, but is instead attached to the vacuum chamber 14 itself. Such plasma sources 40' can produce plasmas from specific gases as are generally required by many processes.

Figure 6:
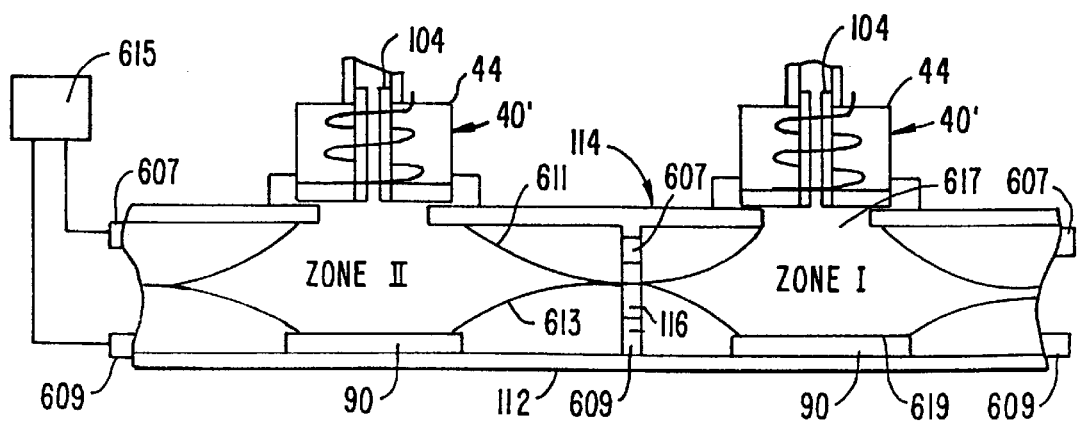

Several such plasma sources 40' can be aligned to sequentially treat a wafer 90 with different plasmas as in the embodiment of the in line system shown in FIG. 6. In this embodiment, wafers 90 are moved by a conveyor 112 through sequential zones, in this embodiment zones I and II, of a continuous processing line 114. Each zone is separated from the adjacent zones by a baffle 116. In one embodiment, the gas in zone I is for a cleaning processing, while the gas in zone II is hydrogen used in implanting. In another embodiment, a cluster tool having load-locks to isolate each processing chamber from the other chambers, and equipped with a robot includes the rf plasma sources 40 of the invention for plasma CVD, plasma etching, plasma immersion ion implantation, ion shower, or any non-mass separated ion implantation technique.

A magnetic field is applied to plasma in the vacuum chamber 114. In a specific embodiment, an electro-magnetic source 607 is applied to an upper vessel portion and an electro-magnetic source 609 is applied to a lower vessel portion. These sources shape the plasma to form magnetic field lines 611 and 613, which push and shape the plasma away from walls of the vessel. In a specific embodiment, the electro-magnetic source can be a single or multiple conductors such as a plurality of wires or cables, which conduct current. In a specific embodiment, the conductor is a plurality of wires, which are wrapped around the periphery of the vessel. The wires are suitably constructed such that they carry enough electric current to influence the plasma in the vessel. In one embodiment, the wires are a plurality of insulated wires that are wrapped around a periphery of the vessel. The insulated wires each include a conductive core. Magnetic source 607 couples to a power source 615, which supplies direct current in one direction to the wires. Magnetic source 609 couples to power source 615, which supplies direct current in another direction (which is opposite of magnetic source 607). The power source can be any suitable power source such as a DC power supply product made by a company called Hewlett Packard, but is not limited.

In a specific embodiment, a combination of the rf plasma source 40' and electro-magnetic sources 607, 609 create "cusp" regions 617 and 619. Here, the combination of the sources are operated in a manner which maintains a substantial portion of the plasma confined to a spatial area away from the walls, which prevents recombination of plasma species near the walls. The combination of the sources also provide for a higher plasma density. The high density plasma uses inductive coupling from the rf plasma source and uses the magnetic sources 607 and 609 to shape the plasma. The shaped plasma also has a much higher energy and density than the plasma created by only the rf plasma source. The high density plasma can be used for a number of applications including, plasma immersion ion implantation and others.

Figure 7:
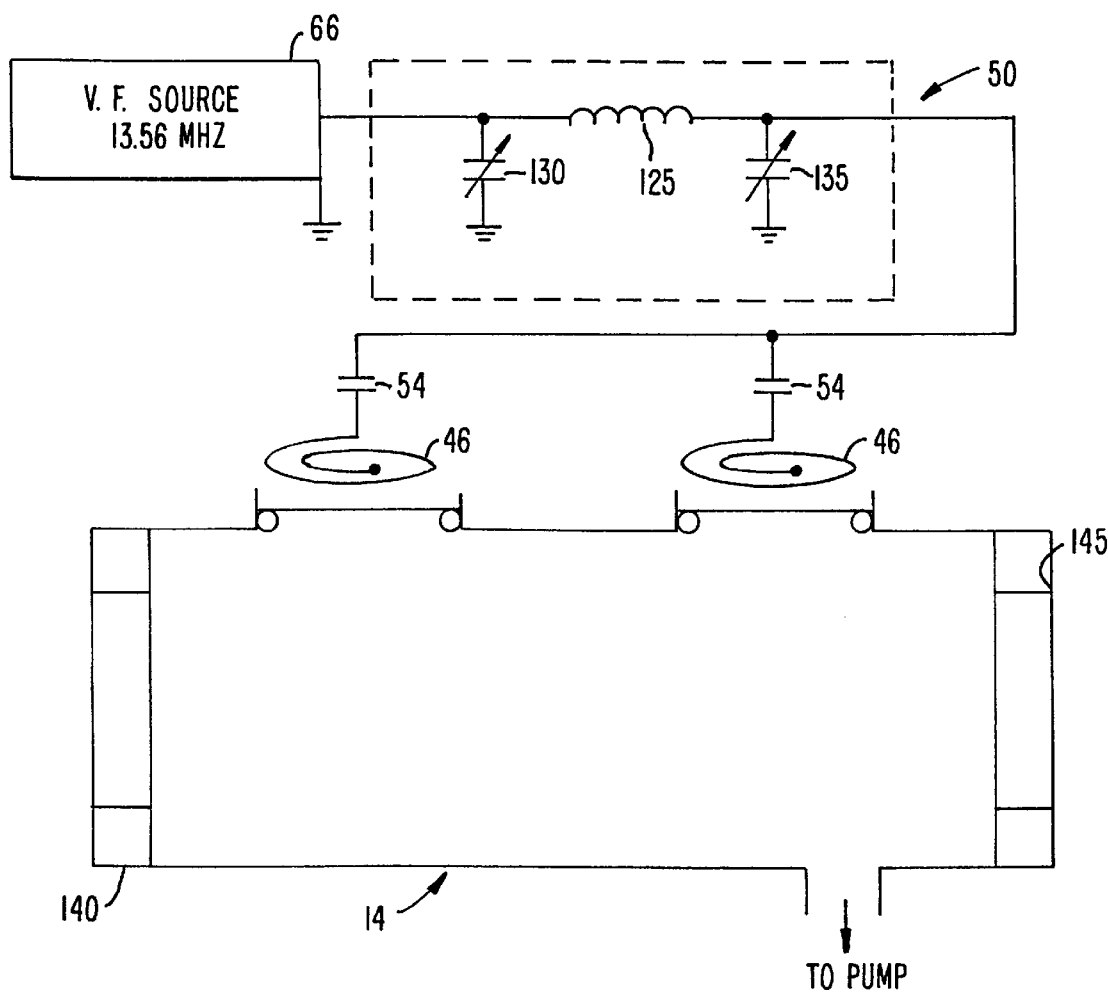

FIG. 7 depicts an embodiment of the system of the invention using two plasma sources. In this embodiment each source is an inductive pancake antenna 3–4 inches in diameter. Each antenna 46 is constructed of a ¼ inch copper tube and contains 5–6 turns. Each antenna 46 is connected to a matching network 50 through a respective 160 pf capacitor. The matching network 50 includes a 0.03 $\mu$H inductor 125 and two variable capacitors 130, 135. One variable capacitor 130 is adjustable over the range of 10–250 pf and the second capacitor 135 is adjustable over the range of 5–120 pf. The matching network 50 is tuned by adjusting the variable capacitor 130, 135. The matching network 50 is in turn connected to an rf source 66 operating at 13.56 MHz or other suitable frequencies. Electro magnetic sources 140, 145 are positioned around the circumference of the chamber. These sources include a conductive wire(s) 140, which is wrapped around a lower portion of the chamber. The wires 140 provide current in one direction. Conductive wire(s) 145 is wrapped around an upper portion of the chamber. The wires 145 provide current in another direction, which is opposite of the direction of wires 140. The combination of these wires and the rf source provides a high density plasma discharge.

While the above description is generally described in a variety of specific embodiments, it will be recognized that the invention can be applied in numerous other ways. For example, the improved plasma source design can be combined with the embodiments of the other FIGS. Additionally, the embodiments of the other FIGS. can be combined with one or more of the other embodiments. The various embodiments can be further combined or even separated depending upon the application. Accordingly, the present invention has a much wider range of applicability than the specific embodiments described herein.

In a specific embodiment, the present invention provides a method according to an embodiment of the present invention. The method can be briefly outlined as follows:

1. Provide a work piece (e.g., silicon wafer);
2. Introduce the work piece into a vacuum chamber;
3. Evacuate the vacuum chamber to a first pressure;
4. Introduce a gas (e.g., hydrogen) into the vacuum chamber;
5. Ignite the gas to form a plasma using an rf power source;
6. Maintain the plasma using the rf power source;
7. Pump down the chamber to a second pressure;
8. Apply magnetic field onto plasma;
9. Form cusp(s) with plasma;
10. Form enhanced plasma mode;
11. Apply bias between plasma and work piece;
12. Accellerate particles from plasma toward work piece;
13. Form a concentration of particles at a selected depth in the work piece;
14. Purge chamber;
15. Remove implanted work piece; and
16. Perform remaining fabrication steps, as desired.

The above sequence of steps is used to provide a method according to the present invention. The present method includes steps of providing a work piece, forming a high density plasma, and accellerating particles from the plasma into a work piece. By way of substantially pure plasma species, the present invention provides a substantially uniform implant for a variety of processes such as layer transfer techniques. Further details of the present method are shown by way of reference to the FIGS. below.

Figure 8:
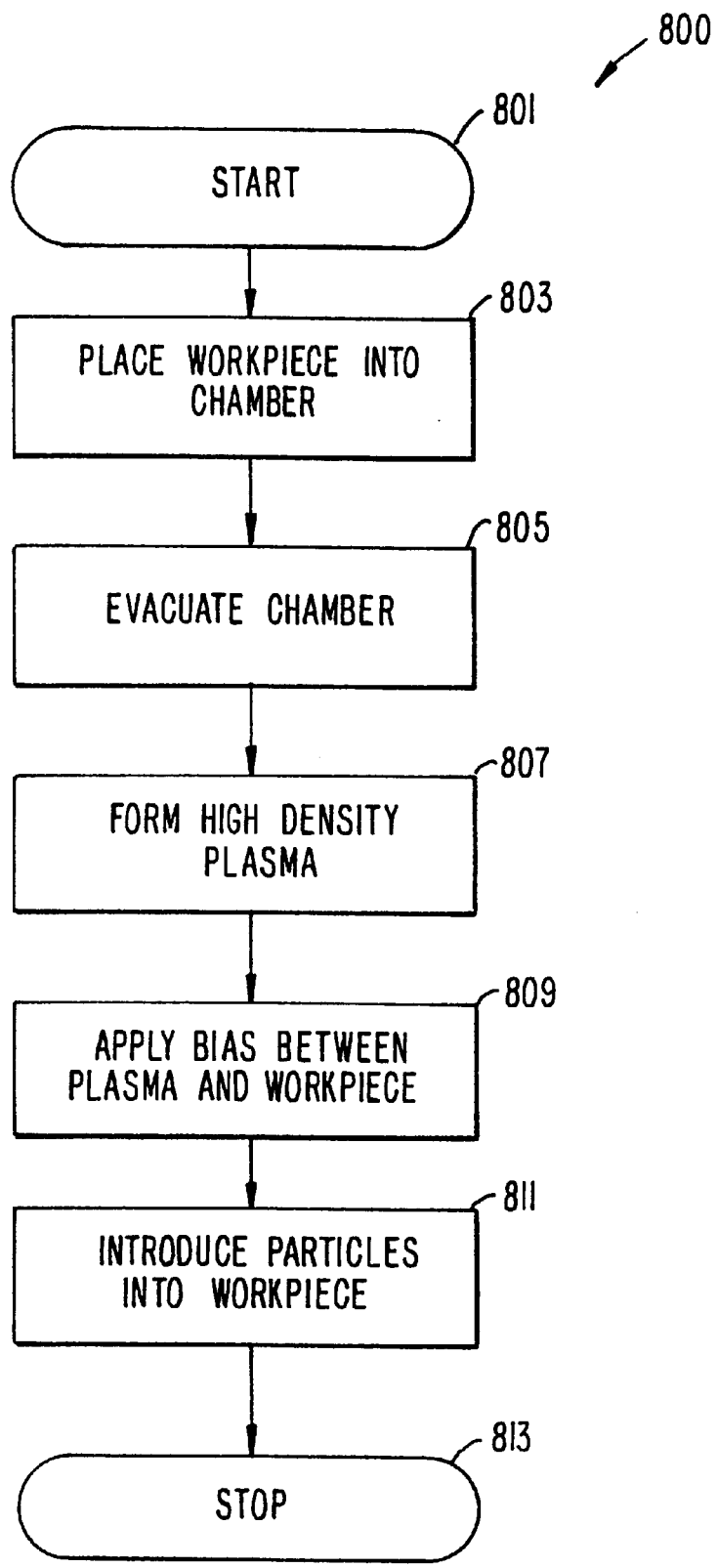
FIGS. 8–8A are simplified diagrams of plasma treatment methods according to embodiments of the present invention.

FIG. 8 is a simplified flow diagram of a method 800 for implanting particles according to an embodiment of the present invention. The diagram is merely an example and should not limit the scope of the claims herein. One of ordinary skill in the art would recognize other variations, modifications, and alternatives. As shown, the method begins at start, which is step 801. A work piece (e.g., silicon wafer) is placed into the chamber. In some embodiments, a robot or transfer arm performs the placement step. The chamber is pumped down (step 805), which evacuates the chamber. Once the chamber is evacuated, a high density plasma is formed (step 807). The high density plasma is formed using any one of the techniques described herein, as well as others. In a preferred embodiment, the high density plasma is substantially pure hydrogen $H_1+$, which is described herein. The substantially pure hydrogen has a positive ionic charge.

To implant these particles into the work piece, a negative bias is applied to the work piece. In one embodiment, the bias is pulsed. Alternatively, the negative bias is a straight D.C. current or a quasi D.C. current, which is made of a plurality of pulses. The bias pulls the particles form the plasma into the work piece. That is, the voltage bias accelerates the particles through a surface of the work piece to a selected depth within the work piece. Once the particles are introduced into the work piece, additional processing can be performed. These processes include, among others, a layer transfer process such as a controlled clevage process, which is described in U.S. Ser. Nos. 09/026,115; 09/026,027; and 09/026,034, commonly assigned, and which are all incorporated by reference herein. Additional layer transfer synthesis of SOI materials processes such as the Smart Cut™ process of Soitec of France.

Figure 8A:
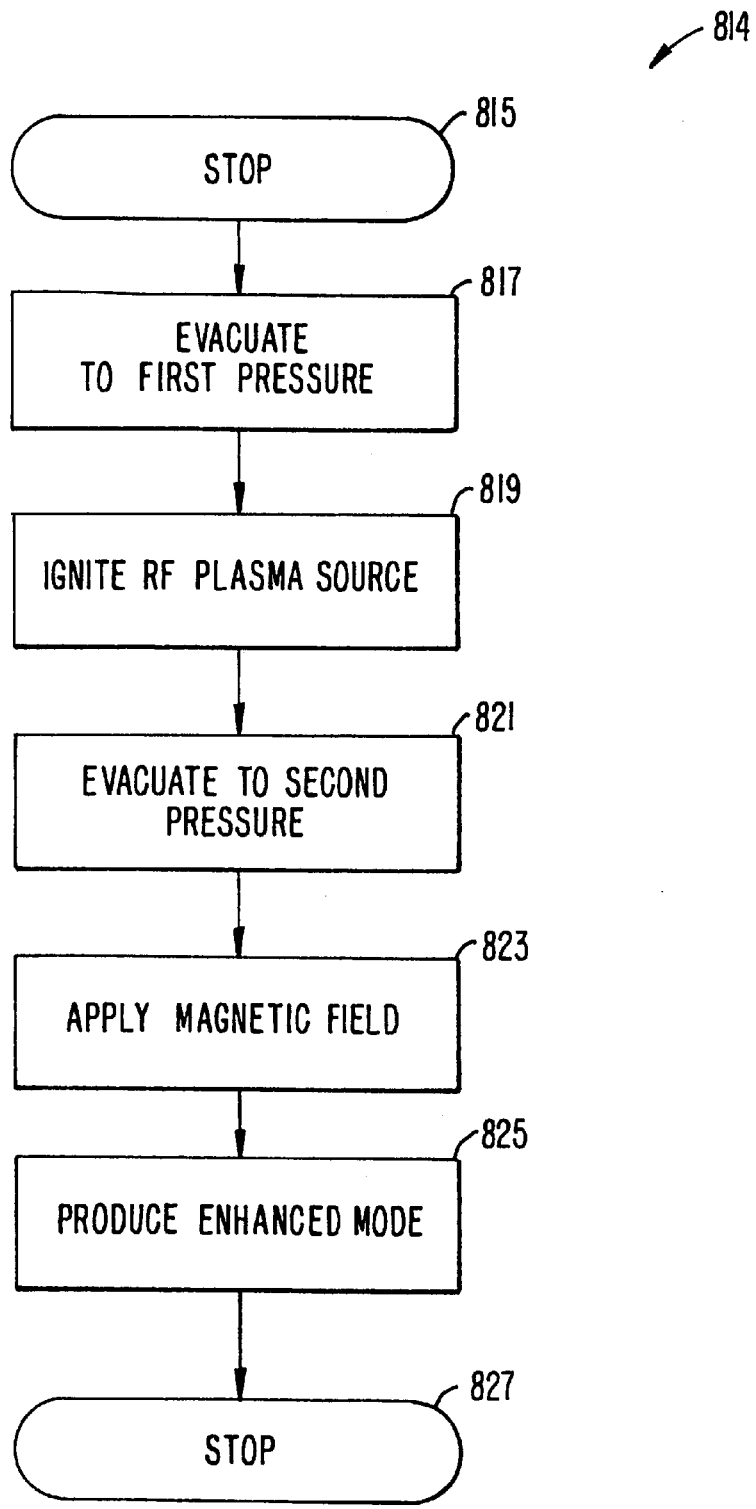

FIG. 8A is a simplified flow diagram of a method 814 for igniting a high density plasma according to an embodiment of the present invention. The diagram is merely an example and should not limit the scope of the claims herein. One of ordinary skill in the art would recognize other variations, modifications, and alternatives. The present method begins with a start step (step 815). The present method includes, among other steps, pumping down or evacuating (step 817) the vacuum chamber to a first pressure. The rf power source is applied which ignites (step 819) and maintains an inductively coupled plasma. The chamber is then pumped down or evacuated to a second pressure, which is lower than the first pressure, where the magnetic field is applied (step 823). The magnetic field is applied in the manner described herein as well as others. In some embodiments, the magnetic field is applied before step 817 or any other time, when it is convenient. The combination of the applied magnetic field and the rf power provides an enhanced plasma, which is substantially a single isotope, e.g., $H_1+$. The substantially pure plasma can be used for a variety of processes such as the ones described herein, as well as others.

Although the above has been generally described in terms of specific methods, the present invention can also be applied to a variety of other plasma processes. For example, the present invention can be applied to a plasma source ion implantation system using a plasma immersion ion implantation system or any non-mass separated system such as ion shower or the like. Accordingly, the above description is merely an example and should not limit the scope of the claims herein. One of ordinary skill in the art would recognize other variations, alternatives, and modifications.

Experiments

To prove the principles and operation of the present invention, experiments were performed. In these experiments, a chamber having a diameter of about thirty inches and a height of about thirty six inches was used. The chamber was made of stainless steel. Waban Technology, Inc. of Massachusetts (now Silicon Genesis Corporation) provided the chamber. A single inductive coil was placed on an upper region of the chamber. The inductive coil was placed on a substantially planar window, which was concentrically aligned overlying a susceptor region of the chamber. The inductive coil used a ¼-inch diameter copper coil, which was wrapped about FIVE times about a center region. The inner region of the inductive coil was grounded while the outer region of the coil was subjected to rf power of 13.56 MHz. The overall diameter of the inductive coil was about twelve inches. The power supplied to the coil was maintained at about 4.5 kilo-watts during operation. The inductive coil was made of a copper material and had cooling fluid running in the coil to prevent the coil from heating up excessively. A silver plate was coupled to the coil to enhance cooling.

Magnetic sources were constructed by way of insulated wires. A plurality of insulated wires were wrapped surrounding the circumference of the chamber. A first group of wires were wrapped in an upper circumference region of the chamber. About 15 to 20 wraps were made using these wires. In a center region of the chamber, which is above the susceptor, a second group of wires were wrapped about the circumference region of the chamber. About 15 to 20 wraps were made using these wires. A power source was applied to each of the groups of wires. A direct current ("D.C.") power source of about 5 volts and about 40 Amps. was applied to the top group of wires. A D.C. power source of about 5 volts and about 40 Amps. was applied to the bottom group of wires. Details of applying the proper voltage and current are described in more detail below.

A hydrogen gas source was applied to provide hydrogen gas into the chamber. The hydrogen gas source was semiconductor grade (99.9995%) purity hydrogen gas. The gas entered the chamber at a flow rate of 20 sccm, which was at a temperature of room (or ambient) and pressure of a few milli-torr. A mass flow controller was used to selectively introduce the hydrogen gas into the chamber. The mass flow controller was made by a company called MKS, but is not limited. The mass flow controller selectively allowed hydrogen gas to enter into the chamber.

In operation, a work piece such as a blank 8-inch silicon wafer is placed into the chamber. A vacuum pump evacuates the chamber. The vacuum is generally maintained such that the chamber has a pressure of about 0.5 milli-torr and less during processing. Of course the particular pressure used depends highly upon the application. The vacuum pump can be any suitable unit such as a Turbo Molecular pump made by a company called Varian, but is not limited to such a pump. Hydrogen gas is allowed to enter the chamber. Next, rf power is applied to the ignite the plasma. The rf power is at about 4 kW. A glow discharge can be seen through a glass viewing window on the side of the vacuum chamber. The mixture of the hydrogen bearing particles are measured.

A mass spectrometer system was used to measure the relative concentrations of hydrogen bearing particles. In the present example, a mass spectrometer made by a company called Hiden of England was used. Here, a probe was placed into the chamber, as shown. The probe was used at two locations in the chamber to sense the type of hydrogen in the plasma. The probe was inserted into the chamber at a first position, which is against the wall region of the chamber. A measurement was taken at the first position. Next, the probe was moved to a second location in the chamber, as shown. A measurement was taken at the second position. Table 1 lists the mixture of hydrogen bearing particles for two trials. The first trial measures hydrogen for a source where only an rf source is applied. The second trial measures hydrogen for a source that includes the rf source and the magnetic field source.

TABLE 1

List of Concentrations of Hydrogen

| Power Source(s) | Hydrogen (1) | Hydrogen (2) | Hydrogen (3) |
|---|---|---|---|
| Rf source | <1% | 60% | 40% |
| Rf source + field | 99.96% | <1% | <1% |

As seen in Table 1, the concentration of hydrogen bearing particles include hydrogen (1) (e.g., $H_1+$), hydrogen (2) (e.g., $H_2+$ and $H_2$) and hydrogen (3) (e.g., $H_3+$). By way of inductive coupling from the rf power source, the hydrogen bearing particles include H(1), H(2), and (3). The presence of all three forms of hydrogen are believed to be based upon recombination of certain species of hydrogen at, for example, a wall region. The plasma density using inductive coupling is about $5 \times 10^9$ ions/cubic centimeter.

When the pressure is about 1 milli-torr, the magnetic field is applied to the chamber by way of the D.C. power source(s). The plasma discharge transforms into a state that is dominated by H(1). An inspection of the illumination of the hydrogen discharge through the glass window reveals a higher intensity of light illuminating from the plasma. The illumination is much brighter (i.e., the color turned from blue to magenta) than the plasma discharge made by way of only the rf source.

The relative concentrations of hydrogen bearing particles have also changed. Table 1 lists the relative change, where hydrogen (1) is now greater than 99%, hydrogen (2) is less than 0.05%, and hydrogen (3) is less than 0.001%. Accordingly, the plasma discharge becomes substantially hydrogen (1), which we call the "protonic mode" of hydrogen.

Figure 9:
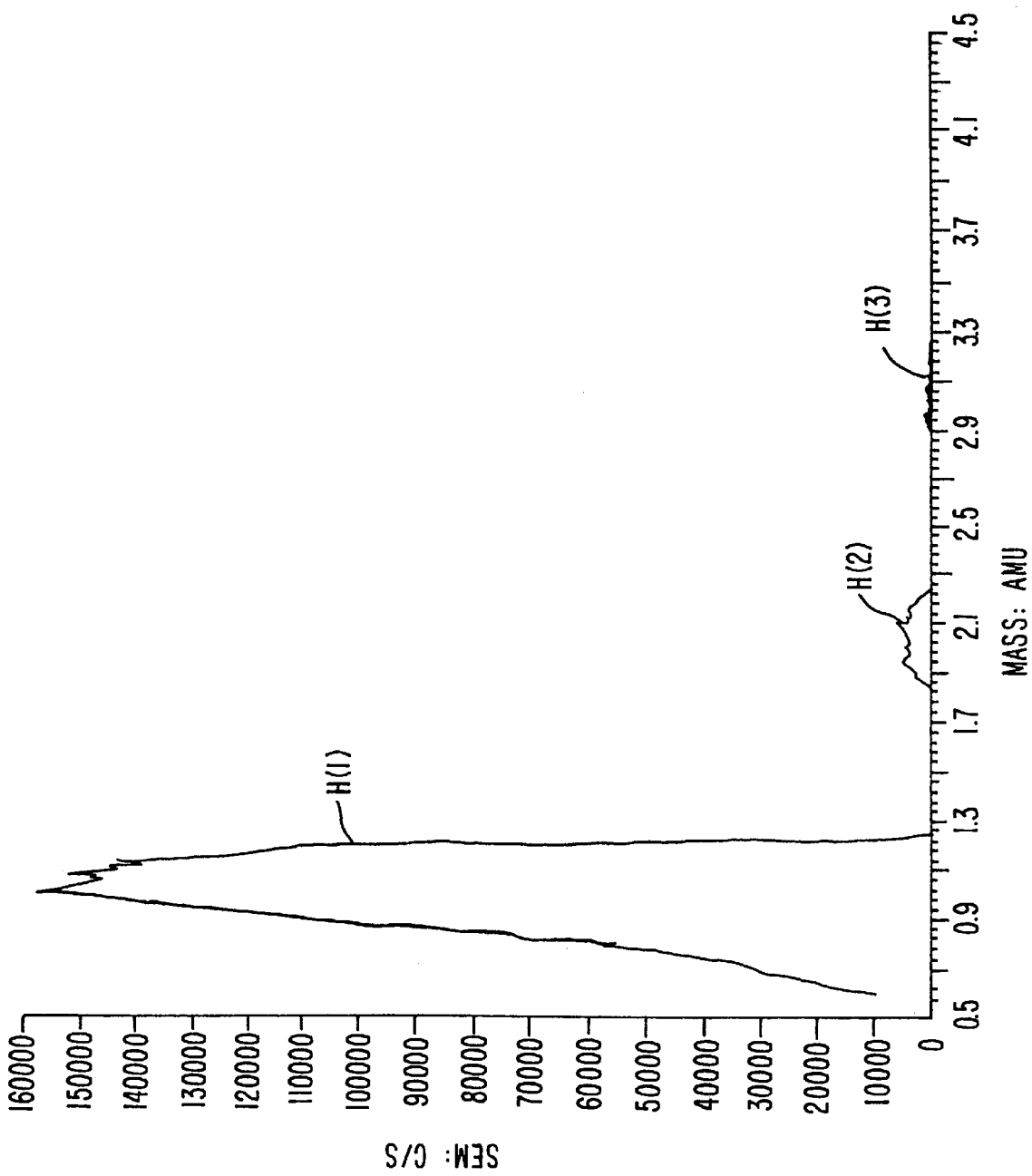
FIGS. 9–10 are simplified diagrams of experimental information according to embodiments of the present invention

FIG. 9 illustrates a relative measurement of the hydrogen bearing particles. The hydrogen bearing particles include at least H(1), H(2), and H(3). As shown, the left axis illustrates intensity of hydrogen bearing particles in units of counts/second ("SEM"). The lower axis illustrates mass of the hydrogen bearing particles in atomic mass unit (herein "AMU"). The peak near the AMU of value 1 reveals H(1). The smaller peaks near the AMU values of 2 and 3 refer, respectively, to H(2) and H(3). A simple calculation made using the FIG. shows an H(1) concentration relative to H2 and H3 of 99.96% purity, which is believed to be significant. It is believed that present conventional techniques cannot achieve such high purity by way of conventional plasma processing tools and the like.

To implant the hydrogen bearing particles, a voltage bias (i.e., quasi DC pulse) is applied between the plasma and the work piece. The work piece is maintained at a voltage potential of about less than 50 kV. The plasma source has an applied voltage potential of about a few tens of volts. By way of the differential in voltage between the work piece and the plasma discharge, the hydrogen bearing particles are accelerated into the surface of the work piece. The hydrogen bearing particles accelerate through the surface of the work piece and rest at a selected depth underneath the surface of the work piece. It is believed that since the hydrogen bearing particles are substantially a single species, a substantial portion of the plasma implants into the substrate in a similar manner. By way of this manner, a substantially uniform implant is achieved.

Figure 10:
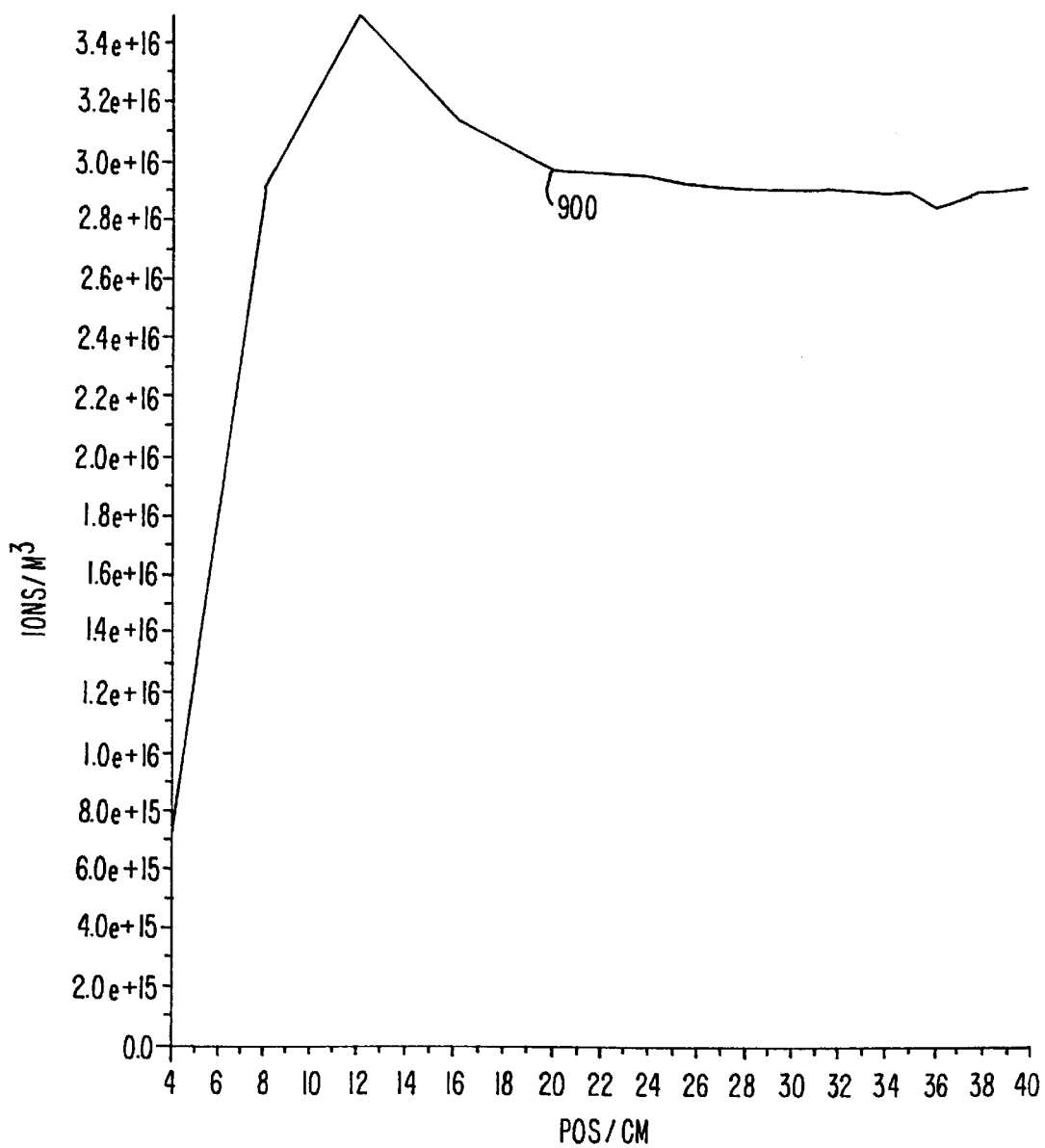

By way of the present plasma source, a high degree of uniformity in the implant is achieved. FIG. 10 is a simplified profile 900 of an implant according to the present experiment. As shown, the particles counts were measured by way of a Langmuir probe. The probe measured a substantial uniform distribution of implanted particles that were measured using the probe. As shown, the concentration centered around $2.9 \times 10^{16}$ ions/r$^3$. The concentration does not substantially vary about the region, which is occupied by a substrate. The substrate region is defined outside of the 28 centimeter position, where the 40 centimeter position defines a center portion of the substrate.

In a specific embodiment, the present invention achieves other ion concentrations, which enhance plasma immersion ion implantation. As merely an example, the hydrogen ion concentration is greater than about $1 \times 10^{10}$ ions/cm$^3$, or greater than about $5 \times 10^{10}$ ions/cm$^3$, or greater than about $5 \times 10^{11}$ ions/cm$^3$, or greater than about $1 \times 10^{12}$ ions/cm$^3$. Conventional ICP sources yielded no greater than about $1 \times 10^9$ hydrogen ions/cm$^3$ using similar plasma tools. Accordingly, the present plasma source yields about 100 times or 200 times higher plasma densities than conventional tools.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A plasma treatment method comprising:
    forming an rf plasma discharge in a vacuum chamber, said plasma discharge including an inductive coupling structure, said inductive coupling structure comprising a first cusp region at a first end of said structure and a second cusp region at a second end of said structure;
    wherein said first cusp region is provided by a first electro-magnetic source and said second cusp region is provided by a second electro-magnetic source; and
    wherein said first electro-magnetic source and said second electro-magnetic source confining a substantial portion of said rf plasma discharge to a region away from a wall of said vacuum chamber.

2. The method of claim 1 wherein said rf plasma discharge is provided by a single coil disposed overlying an upper surface of said vacuum chamber.

3. The method of claim 1 wherein said rf plasma discharge is provided by a plurality of coils, each of said coils being disposed overlying an upper surface of said vacuum chamber.

4. The method of claim 2 further comprising a tuning circuit coupled to said single coil.

5. The method of claim 1 wherein said first cusp is toward said a rf plasma source.

6. The method of claim 1 wherein said second cusp region is toward said susceptor.

7. The method of claim 1 further comprising applying a voltage bias between said rf plasma discharge and a workpiece to introduce partices in said rf plasma discharge into a surface of said workpiece.

8. The method of claim 1 further comprising providing a direct current from a direct current power supply to said first electro-magnetic source.

9. The method of claim 8 further comprising providing a direct current from a direct current power supply to said second electro-magnetic source.

10. The method of claim 9 wherein said first electro-magnetic source is coupled to said direct current power supply to current that flows in a first direction.

11. The method of claim 10 wherein said second electro-magnetic source is coupled to said direct current power supply to supply current that flows in a second direction, said second direction being opposite of said first direction.

12. The method of claim 1 further comprising feeding hydrogen gas into said vacuum chamber to form said rf plasma discharge comprising hydrogen bearing particles.

13. The method of claim 1 wherein said rf plasma discharge is a hydrogen bearing plasma.

14. The method of claim 1 wherein said rf plasma discharge is substantially a hydrogen bearing plasma of $H_1^+$ particles.

15. The method of claim 1 further comprising providing a workpiece on a susceptor in said vacuum chamber.

16. The method of claim 11 further comprising accelerating particles from said rf plasma discharge into and through a surface of a work piece to a selected depth underlying said surface of said work piece.

\* \* \* \* \*